United States Patent [19]

Lam et al.

[11] Patent Number: 4,656,731
[45] Date of Patent: Apr. 14, 1987

[54] METHOD FOR FABRICATING STACKED CMOS TRANSISTORS WITH A SELF-ALIGNED SILICIDE PROCESS

[75] Inventors: Hon W. Lam, Dallas; Ravishankar Sundaresan, Garland, both of Tex.

[73] Assignee: Texas Instruments Incorporated, Dallas, Tex.

[21] Appl. No.: 762,657

[22] Filed: Aug. 5, 1985

[51] Int. Cl.[4] .................. H01L 21/88; H01L 29/78; H01L 27/02
[52] U.S. Cl. ................... 29/576 J; 29/576 B; 29/571; 29/591; 148/1.5; 148/175; 148/187; 357/42; 357/23.4; 357/23.7; 357/91
[58] Field of Search ............ 148/1.5, 187, 175; 29/571, 576 B, 576 J, 591; 357/42, 23.4, 23.7, 91

[56] References Cited

U.S. PATENT DOCUMENTS

| | | | |
|---|---|---|---|
| 4,476,475 | 10/1984 | Naem et al. | 357/59 |
| 4,488,348 | 12/1984 | Jolly | 29/571 |
| 4,554,570 | 11/1985 | Jastrebski et al. | 357/23.4 |
| 4,554,572 | 11/1985 | Chatterjee | 357/42 |
| 4,555,721 | 11/1985 | Bansal et al. | 357/42 |
| 4,555,843 | 12/1985 | Malhi | 29/571 |

OTHER PUBLICATIONS

Robinson et al, IEDM-IEEE, Wash., D.C. Dec. 1983, p. 530.
Goeloe et al, IEDM-IEEE 1981, p. 554.
Alperin et al, IEEE-Trans. Electron Devices, ED32 (1985) 141.
Murarka et al, IEEE-J. Solid St. Circuits, SC15 (1980) 474.

Primary Examiner—Upendra Roy
Attorney, Agent, or Firm—Melvin Sharp; N. Rhys Merrett

[57] ABSTRACT

A method for siliciding interconnects on a vertically integrated device utilizing stacked CMOS technology includes a step for blocking off the p-channel devices. This blocking step is utilized to block the p-channel device in a stacked CMOS pair prior to forming titanium di-silicide on the exposed polysilicon interconnects. A mask is formed on the top polysilicon layer that forms the p-channel device and then patterned to remove the mask and the top polysilicon layer to expose the underlying polysilicon layers. A sidewall oxide is then formed to completely seal the p-channel devices and then the exposed silicon and polysilicon surfaces subjected to a self-aligned silicide process.

11 Claims, 9 Drawing Figures

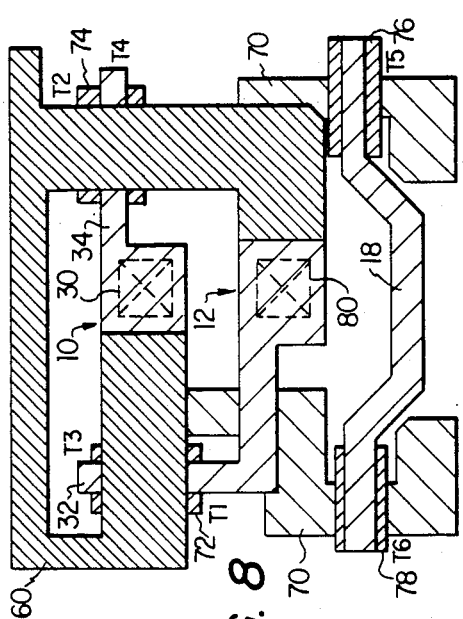
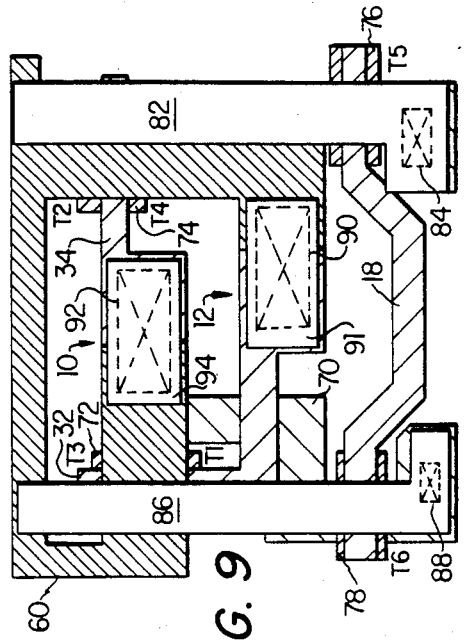
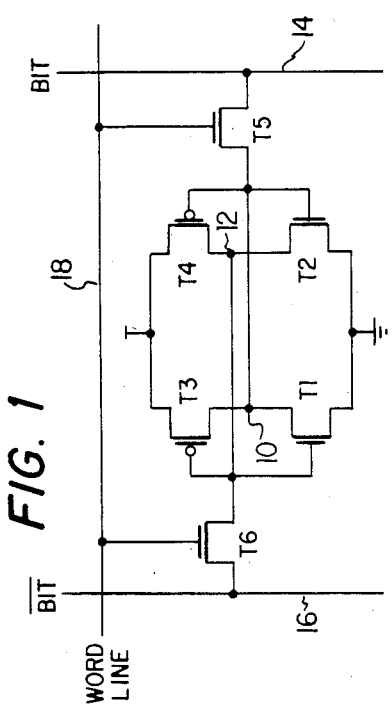
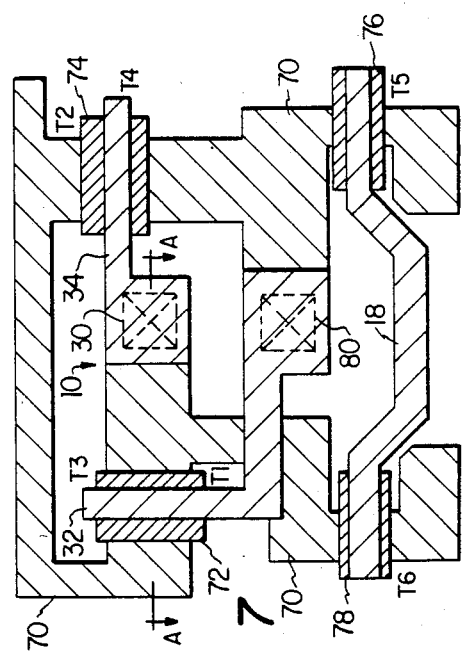

METHOD FOR FABRICATING STACKED CMOS TRANSISTORS WITH A SELF-ALIGNED SILICIDE PROCESS

TECHNICAL FIELD OF THE INVENTION

The present invention pertains in general to the fabrication of CMOS transistors and, more particularly, to the fabrication of stacked CMOS transistors.

BACKGROUND OF THE INVENTION

As integrated circuit technology advances, the demand for increased packing density, low power dissipation per square centimeter and compatibility between the various technologies increases. High packing density, usually obtained through device shrinkage, requires highly sophisticated processing techniques such as E-beam lithography, reactive ion etching, transient annealings, etc. Lower power dissipation is normally obtained utilizing CMOS structures, in which the pullup device of the CMOS pair may be replaced by a complimentary load device.

Increased packing density for VLSI applications is primarily achieved through scaling down device dimensions. One method for scaling down the dimensions is to "vertically" integrate the chip by stacking active layers on top of each other and building devices therein. These are commonly referred to as "stacked CMOS" devices wherein the p-channel transistor in a CMOS pair is stacked on top of the n-channel transistor. An overview of stacked CMOS devices can be found in J.-P. Colinge, "Laser-Recrystallized Silicon As A Device-Worthy Material For SOI And 3D Integrated Circuits", Universite Catholique De Louvain Faculte Des Sciences Appliquees, September 1984, pp. 47–65; and C. E. Chen, H. W. Lam, S. D. S. Malhi, R. F. Pinizzotto, IEEE Electron Dev. Lett. 4,272, (1983).

Stacked CMOS devices are normally fabricated by first patterning an n-channel region. A gate oxide is then formed on top of the n-channel region followed by a first polycrystalline silicon layer to form the first layer of n-channel devices and various interconnects. A second layer of polycrystalline material is then deposited thereon. The second poly layer is patterned to form the sources and drains of a second layer of p-channel transistors and also the p-channel region thereof over select ones of the first layer n-channel transistors with the gates of the n-channel transistors being common to the p-channel devices. The last processing steps involve patterning metal interconnects to interconnect the various stacked devices in a given circuit. The use of stacked CMOS reduces the number of interconnects and contact holes. However, additional processing steps are necessary for providing the metallization pattern. It is desirable to provide a processing method for reducing the number of steps necessary to form the interconnects in the stacked CMOS circuits. Stacked CMOS devices are generally described in U.S. Pat. No. 4,554,572 and U.S. patent application Ser. No. 656,055, both assigned to Texas Instruments Incorporated.

SUMMARY OF THE INVENTION

The present invention disclosed and claimed herein comprises a method for forming a stacked CMOS semiconductor device. The method comprises first forming a plurality of first layer transistors with polycrystalline silicon gates and various polysilicon interconnects on a substrate. A second layer of transistors is then formed over select ones of the first layer transistors with the gate of the first layer transistors being common to the associated second layer transistors. The second layer of transistors are then encapsulated and the remaining exposed silicon surfaces of the first layer silicided with titanium di-silicide to increase the conductivity thereof. The final interconnect pattern is then formed.

In another embodiment of the present invention, the second layer of transistors and the mask are formed by first depositing a gate oxide over the substrate followed by a second layer of polysilicon. Channel regions are then defined in the second poly layer with source and drain regions defined adjacent thereto. The substrate is then covered with an oxide mask layer and a pattern defined thereon. The portions of the oxide mask layer and the second poly layer not defined in the pattern are then removed to expose the underlying silicon areas in the first layer. The peripheral edges are then covered with a sidewall oxide to fully encapsulate the second layer transistors and then the exposed silicon areas subjected to a silicide process to form titanium di-silicide thereon.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates a schematic diagram of an SRAM cell which is illustrative of a circuit utilizing stacked CMOS technology;

FIG. 7 illustrates a top view of the SRAM cell after formation of the first poly layer of FIG. 1;

FIG. 8 illustrates a top view of the SRAM cell after formation of the p-channel transistors with the oxide mask formed thereon as illustrated in FIG. 5; and FIG. 9 illustrates a top view of the final SRAM cell with the bit lines formed thereon.

DETAILED DESCRIPTION OF THE INVENTION

Referring now to FIG. 1, there is illustrated a schematic diagram of a typical memory cell for a Static Random Access Memory (SRAM). The SRAM cell is merely illustrative of the use of stacked CMOS devices and the method of fabrication in accordance with the present invention. The basic storage elements in the SRAM cell are comprised of an n-channel transistor T1 and an n-channel transistor T2. Transistors T1 and T2 have the sources thereof tied to ground with the drain of transistor T1 tied to a node 10 and the drain of transistor T2 tied to a node 12. A p-channel transistor T3 has the drain thereof connected to node 10 and the source thereof tied to $V_{CC}$. A p-channel transistor T4 has the drain thereof connected to node 12 and the source thereof connected to $V_{CC}$. The gates of transistors T1 and T3 are tied to node 12 and the gates of transistors T2 and T4 are connected to node 10.

Transistors T1 and T3 form one transistor pair and transistors T2 and T4 form a second transistor pair, each of the transistor pairs being fabricated as a stacked CMOS device. Information is stored on either the node 10 or 12, the information being complementary. Information stored on node 10 is output to a bit line 14 through an n-channel transistor T5. The information on node 12 is output to an inverse bit line 16 through an n-channel transistor T6. The gates of transistors T5 and T6 are connected to a word line 18.

During fabrication of the devices, the transistor pairs are "vertically" integrated; that is, transistor T3 is physically disposed directly over transistor T1 and transistor T4 is physically disposed directly over transistor T2. There are a number of patterning layers required to pattern the various interconnects, etc. With conventionally stacked CMOS devices, transistors T1, T2, T5 and T6 are fabricated in a single layer in addition to the interconnects for the sources of transistors T1 and T2 and the word line 18. In the next step of fabrication, transistors T3 and T4 are formed over transistors T1 and T2 and then a conductive layer formed to interconnect the sources of transistors T3 and T4. The final fabrication step requires forming the bit lines and the various interconnects to $V_{CC}$ and $V_{SS}$. As will be described hereinbelow, after fabrication of p-channel transistors T3 and T4, they are isolated and the conductivity of the word line 18 increased by a self-aligned process wherein titanium di-silicide is formed over a polycrystalline silicon (poly) run. If the transistors T3 and T4 were not isolated, the silicide process would require an additional lithography step to isolate the drain, source and gate of the p-channel transistors. With the method of the present invention, transistors T3 and T4 are isolated prior to siliciding the poly interconnects, thus reducing the overall number of steps required to fabricate stacked CMOS devices with a self-aligned silicide process.

Figure 2:
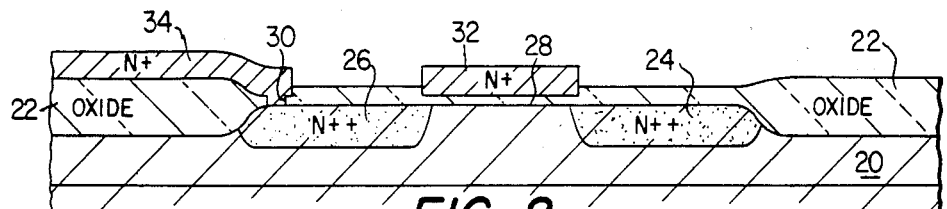
FIG. 2 illustrates a cross-sectional view of the silicon substrate after patterning of the first poly layer.

Referring now to FIG. 2, there is illustrated a cross-sectional diagram of one step in the fabrication process for a stacked CMOS device comprised of one of the pairs T1–T3. In conventional fabrication of CMOS integrated circuits, a thin wafer of semiconductor material of one type conductivity, such as that identified by reference numeral 20 in FIG. 2, is first masked by a thick oxide layer. The oxide is then removed in a pattern to expose only those areas into which conductivity affecting impurities are to be diffused to form a "moat". The substrate 20 is then subjected to diffusion of the desired impurities at temperatures suitable for such diffusion and, after the desired penetration and concentrations have been achieved and oxide is regrown over the moat, the wafer is removed from the diffusion environment. A surface insulating layer 22, referred to as a field oxide of silicon, results from oxide growth and diffusion steps in the process, thus creating a layer of sufficient thickness so that later, when the thin layers of metallization are applied, any electric fields developed in normal operation of the devices are insufficient to adversely affect operation of those portions of the semiconductor element, other than those where the insulating layer is intentionally thinned.

After forming the field oxide layer 22, a thin layer of oxide is then formed over the moat followed by a thin layer of nitride. The nitride layer is then patterned to define the gate area of the first layer of transistors and expose the source and drain regions. Arsenic is then implanted followed by a subsequent annealing step to form an N++ source region 24 and a n++ drain region 26. The thickness over the oxide layer of the source 24 and drain 26 is then increased with a subsequent oxidation step. The nitride layer is then removed.

After forming the source and drain regions 24 and 26, a thin layer of poly is formed on the substrate to a thickness of approximately 1500 Angstroms. A contact 30 is then formed through the thin poly layer and underlying oxide layer covering the drain region 26 and then another layer of poly deposited thereon to increase the thickness to approximately 5000 Angstroms. This poly layer is referred to as the "first poly layer". The first poly layer is then doped by diffusing of phosphorous from a POCl$_3$ source at 950° C. to dope the poly layer n+. This first poly layer is then patterned to form a gate 32 and a drain to gate run 34 between the drain of one transistor to the gates of another first layer transistor, as will be described hereinbelow. The drain to gate run 34 comprises one of the nodes 10 and 12 of FIG. 1. The first poly layer in which the gate 32 and the drain to source run 34 is formed also comprises the layer in which the word line 18 is formed. This will be illustrated further with respect to FIG. 7 hereinbelow.

Figure 3:
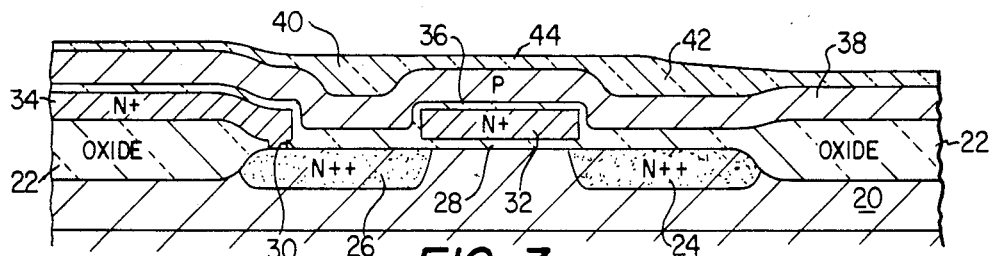
FIG. 3 illustrates a cross-sectional view of the substrate with the second poly layer formed thereon prior to doping of the second poly layer.

After the first poly layer is patterned, a second gate oxide layer 36 is formed on the substrate, as illustrated in FIG. 3. The second gate oxide 36 has a thickness of approximately 600 Angstroms over the gate 32 with a corresponding increase in the thickness of the oxide covering the source and drain regions 24 and 26, respectively, and the field oxide layer 22. Thereafter, a second poly layer 38 is deposited over the entire substrate to a thickness of approximately 1500 Angstroms. The second poly layer 38 is then lightly doped to form a p-type layer by implanting boron therein. The poly layer 38 is a conformal layer such that low regions are formed between the gate 32, the field oxide layer 22 and the run 30 are slightly lower than the portion of the poly layer 38 above the gate 32.

After the second poly layer 38 is doped, a planarization layer of boron impregnated oxide is spun on the surface of the substrate to form a planar layer. The planarized boron impregnated oxide forms a relatively thick layer of approximately 1500 Angstroms in an area 40 above the drain region 26 and a relatively thick portion 42 above the source region 24. A thinner region 44 is formed above the gate 32 having a thickness of approximately 500 Angstroms. The portions above the drain to source run 34 is also a thin region.

Figure 4:
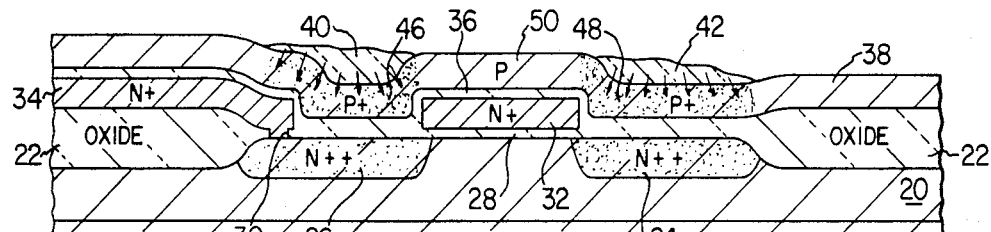
FIG. 4 illustrates a cross-sectional view of the substrate showing the formation of the p+ drains and sources of p-channel transistors in the second poly layer.

After the planarized boron impregnated oxide is spun on, the substrate is subjected to an anisotropic plasma etch to etch away the thin portion 44 to expose the second poly layer 38 directly above the n+ gate 32, as illustrated in FIG. 4. This etch is controlled to leave the boron impregnated oxide layer in the portions 40 and 42 directly above the drain region 26 and the source region 24, respectively. The boron in the portions 40 and 42 is then thermally driven into the second poly layer 38 by subjecting the substrate to a temperature of approximately 950° C. for thirty minutes. This forms a p+ region 46 directly over the drain region 26 and a p+ region 48 directly over the source region 24. The p+ regions 46 and 48 define a p-channel region 50 that is directly over the n+ gate 32 and separated by the second gate oxide layer 36. This process is described in U.S. patent application Ser. No. 656,056, assigned to Texas Instruments Incorporated.

The process thus far described is a conventional process with the vertically integrated p-channel and n-channel devices being defined, the n+ gate 32 being common to both devices. To complete the circuit, conventional techniques would be utilized to pattern the second poly layer 38, form contacts and make the appropriate interconnects. In the present invention, as will be described hereinbelow, the p-channel device formed from the P-region 50 and the p+ regions 46 and 48 are masked off and then the second poly layer 38 with intermediate oxide layers etched away to expose the underlying first poly layer and the source and drain regions of the n-channel devices in the peripheral portions of the SRAM cell. Titanium di-silicide is then formed on the exposed poly layers to increase the conductivity thereof. By masking off the vertically integrated p-channel transistor in the stacked CMOS devices, it is possible to dispense with any photolithography steps required to make the interconnects. If the p-channel transistor were not masked off, a silicide step would short the regions 46 and 48 together.

Figure 5:
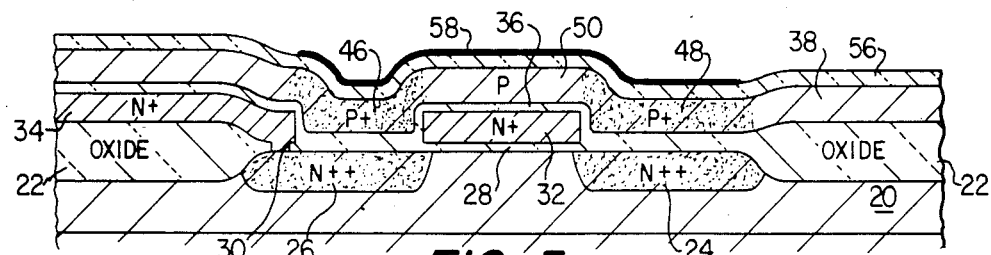
FIG. 5 illustrates a cross-sectional view with the hard oxide mask formed to define the p-channel transistors.

In accordance with the present invention, the remaining boron impregnated regions 40 and 42 in FIG. 4 are removed with a solvent to expose the second poly layer 38. A mask layer of oxide 56 is then deposited over the second poly layer 38 to a thickness of approximately 2000 Angstroms. This oxide is deposited with conventional LPCVD techniques. A pattern is then defined on the oxide mask layer 56 with a layer of photoresist 58. After the photoresist layer 58 is patterned onto the substrate, as illustrated in FIG. 5, the substrate is subjected to a first etch to remove the oxide layer 56 in all areas where the photoresist layer 58 is not disposed over the oxide layer 56. The exposed portions of the second poly layer 38 are then etched to both remove the exposed portions of the poly layer 38 and also expose all of the remaining silicon areas such as the n+ regions 24 and 26 and the exposed portions of the gate 32 and the drain to gate run 34, as will be described hereinbelow. The second etching process utilizes a different plasma etch. However, the etching process utilized to remove the exposed portions of the oxide mask and the second poly layer 38 are both fluorine based etching processes which are conventional in the industry.

Figure 6:
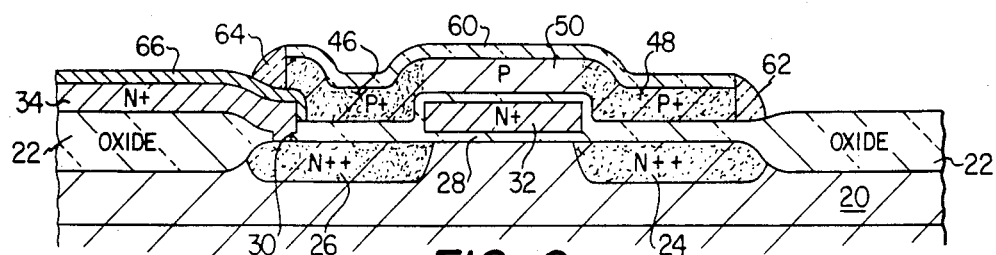
FIG. 6 illustrates a cross-sectional view of the stacked CMOS device with the side oxide formed on the p-channel transistor.

The photoresist layer 58 is then removed to leave behind a hard mask 60 over the p-channel transistor in the stacked CMOS configuration, in addition to defining the edges of the P+ regions 46 and 48 for the drain and source of the p-channel transistor. Another conformal layer of LPCVD oxide is deposited on the substrate to a thickness of 4500 Angstroms. This layer is then annealed for twenty minutes in oxygen and then subjected to an anisotropic etch to clear the oxide from flat surfaces. This etch leaves a sidewall oxide 62 adjacent the exposed edges of the p+ region 48 and the hard mask 60 on one side of the p-channel transistor, and a sidewall oxide 64 on the exposed edges of p+ region 46 and the mask 60. The purpose of the sidewall oxides 62 and 64 is to seal all portions of the p-channel transistor. Therefore, the hard mask 60 in addition to the sidewall oxides 62 and 64 provide a complete encapsulation of the p-channel transistor in each of the stacked CMOS configured devices. The sidewall oxides 62 and 64 and mask 60 are illustrated in FIG. 6.

After forming the sidewall oxides 62 and 64, titanium is then sputtered on the surface of the device in a vacuum apparatus to the thickness of approximately 900 Angstroms. The titanium is then reacted at a temperature of approximately 675° C. in an inert atmosphere such as hydrogen, argon or a vacuum for thirty minutes. This reaction allows the titanium to consume silicon or polysilicon only where it is in contact therewith to form titanium di-silicide. This results in a thickness of titanium di-silicide of approximately 1500 Angstroms. The substrate is then etched in an acid solution to remove the titanium without affecting the titanium di-silicide. For example, a suitable etchant in the case of titanium is a wet etch comprising a solution of $H_2SO_4$ and $H_2O_2$. Since titanium only reacts with silicon, all areas which are covered by oxide such as the p-channel transistors and the field oxide regions 22, have the titanium removed therefrom. The substrate is then annealed for thirty minutes at approximately 800° C. to stabilize and further lower the resistivity of the titanium di-silicide. Titanium di-silicide increases the conductivity of all silicon areas over which it was formed and constitutes a self-aligned process. The titanuim di-silicide layer is referred to by reference numeral 66. The titanuim di-silicide process is described in U.S. Pat. No. 4,545,116 assigned to Texas Instruments Incorporated.

Referring now to FIG. 7, there is illustrated a top view of the circuit of FIG. 1 utilizing the stacked CMOS configurations of FIGS. 2-6, which Figures represent a section through line A—A of FIG. 7. The first step, as described above, is to define a silicon moat 70. A gate oxide area 72 is then masked off for transistor T1, a gate oxide area 74 masked off for transistor T4, a gate oxide area 76 masked off for transistor T5 and a gate oxide area 78 masked off for transistor T6. The remaining areas of the moat 70 are doped to n++. The contact 30 is then formed between the drain of transistor T1 and the gate of transistor T2. The first poly layer is then deposited and patterned to form the gate region 32 of transistor T1 which interconnects with the drain of transistor T2 through a contact 80. The contact 80 comprises the node 12. In a similar manner, the drain to gate run 34 is formed and connected to the drain of transistor T1 through contact 30 and with the gate of transistor T2. The contact 30 comprises the node 10. When the gates of transistors T1 and T2 are formed and interconnected to the respective drains, the word line 18 and the gates of transistors T5 and T6 are also formed.

Referring now to FIG. 8, there is illustrated a top view of the circuit after the second poly layer 38 has been patterned with the hard mask 60 remaining intact. The patterning is such that the sources of p-channel transistors T3 and T4 are interconnected. The drain of transistor T3 is extended such that it is proximate the contact 30 and the drain of transistor T4 is extended such that it is adjacent node 12 at contact 80. As will be described hereinbelow, a simple metal patterning step will provide interconnection of the drains of transistor T3 to node 10 and transistor T4 to moat 70. As described above, all of the peripheral edges of the hard mask layer 60 after patterning thereof are protected by a sidewall oxide to completely encapsulate the p-channel transistors T3 and T4. The titanium di-silicide is then formed on all exposed silicon areas. As can be seen in FIG. 7, the word line is exposed and certain portions of the moat 70 are exposed. Additionally, portions of the drain to gate run 34 are exposed and certain portions of the drain to gate run between the gate of transistor T1 and contact 80 are exposed. These have the conductivity thereof increased by the self-aligned silicide process.

After the exposed surfaces are covered with titanium di-silicide, the final interconnect patterns formed after deposition of a protective oxide layer, as illustrated in FIG. 9. The drain of transistor T5 is interconnected with a bit line interconnect 82 through a contact 84. The drain of transistor T6 is interconnected with the inverse of the bit line through an interconnect 86 through a contact 88. A contact 90 is formed to the gate to drain run for the gate of transistor T1 and the drain of transistor T2 and an interconnection made through an interconnect 91. In a similar matter, a contact 92 is formed between the node 10 and the drain of transistor T3 and an interconnect 94 formed.

In summary, there has been provided a process for utilizing a self-aligned silicide process with vertically integrated devices in a stacked CMOS configuration. This process utilizes a masking step for masking off the vertically integrated p-channel devices in the stacked CMOS pair. Once the p-channel devices are masked, the exposed silicon is silicided to increase the conductivity thereof with the mask protecting the source, gate and drain of the p-channel devices. This protection prevents the silicide process from shorting the drain and gate together.

Although the preferred embodiment has been described in detail, it should be understood that various changes, substitutions and alterations can be made therein without departing from the spirit and scope of the invention as defined by the appended claims.

What is claimed is:

1. The method for forming a vertically integrated integrated semiconductor device, comprising:
   (a) forming a first layer of transistors of a first conductivity type and associated polycrystalline silicon interconnects in accordance with a predetermined first layer pattern on a semiconductor substrate, each of the transistors in the first layer having a source, drain and gate;
   (b) forming a second layer of transistors of a second conductivity type opposite the first conductivity type, each of the second layer transistors having a source, drain and channel region formed in the second layer over selected ones of the first layer transistors in a stacked configuration, the gates of the associated first layer transistors being common to the associated second layer transistors;
   (c) encapsulating the second layer transistors;
   (d) exposing select portions of the polycrystalline silicon interconnects and silicon in the first layer; and
   (e) then forming titanium di-silicide with the exposed silicon on the exposed polycrystalline silicon and silicon in the first layer to increase the conductivity thereof, the encapsulated second layer transistors being protected from having titanium di-silicide formed thereon by the encapsulation thereof during titanium di-silicide formation.

2. The method of claim 1 wherein the step of encapsulating comprises forming an oxide mask around all exposed portions of the second layer transistors.

3. The method of claim 1 wherein the step of forming the first layer transistors comprises:
   forming a plurality of drain and source regions of the first conductivity type in the semiconductor substrate in accordance with the predetermined first layer pattern, each of the source and drain regions separated by a channel region;
   forming a gate oxide with a predetermined thickness over the channel region;
   depositing a layer of polycrystalline silicon over the substrate; and
   patterning the first layer of polycrystalline silicon to define the gates of the first layer transistors and the interconnects between the gates of the first layer transistors and either the gates, sources or drains of other first layer transistors in accordance with the first layer pattern.

4. The method of claim 1 wherein the first conductivity type comprises a p-type semiconductor material and the second conductivity type comprises an n-type semiconductor material.

5. The method of claim 1 wherein the step of forming titanium di-silicide comprises:
   depositing titanium on the substrate to a predetermined thickness such that it is in contact with all exposed silicon and polycrystalline silicon areas in the first layer of transistors and interconnects;
   reacting the titanium with the exposed polycrystalline silicon and silicon surfaces to form titanium di-silicide; and
   selectively removing titanium from the substrate and leaving behind titanium di-silicide, the titanium di-silicide not formed over the encapsulated areas.

6. The method of claim 3 wherein the step of forming and encapsulating the second layer of transistors comprises:
   doping the first polycrystalline silicon layer to the first conductivity type;
   depositing a gate oxide layer over the substrate to a predetermined thickness over the gates of the select ones of the first layer transistors which are in the stacked configuration;
   depositing a second layer of polycrystalline silicon over the substrate and separated from the first layer transistors by the gate oxide;
   forming a channel region of the second conductivity type in the second polycrystalline silicon layer over the gates of the select ones of the first transistors in the stacked configuration wherein the underlying gate of the associated first layer of transistors is common to the associated second layer transistors;
   forming the source and drain of the second layer transistors adjacent the channel region such that all areas adjacent the channel regions have semiconductor properties of the source and drain regions of the second layer transistors;
   depositing an oxide layer over the substrate to a predetermined thickness;
   patterning the oxide layer to define the second layer transistors and the interconnects between the sources of select ones of the second layer transistors, the step of patterning exposing the first layer of transistors and polycrystalline silicon interconnects not covered by the second layer of transistors; and
   forming a sidewall oxide about the peripheral edges of the defined pattern of the second polycrystalline silicon layer and oxide layer to completely encapsulate the defined second layer transistors.

7. The method of claim 5 wherein the first conductivity type is an n-type semiconductor material and the second conductivity type is a p-type semiconductor material.

8. A method for forming a stacked CMOS semiconductor device, comprising:
- forming a plurality of source and drain regions separated by channel regions of a first conductivity type on a semiconductor substrate, select ones of the sources and drains interconnected with select other sources and drains in accordance with a predetermined first layer pattern;
- depositing a first gate oxide layer on the surface of the substrate to a predetermined thickness over the channel regions;
- depositing a first layer of polycrystalline silicon of the first conductivity type over the substrate and isolated from the source, drain and channel region by the first gate oxide layer, the first gate oxide layer having contacts formed therein at a select location to allow the first poly layer to contact select ones of the source and drains;
- patterning the first polycrystalline silicon layer to define gate areas over the channel regions to define first layer transistors and also define interconnect patterns in accordance with a first polycrystalline silicon layer pattern;
- forming polycrystalline silicon channel regions of a second conductivity type over select ones of the gate areas bounded by polycrystalline silicon source and drain regions of the second conductivity type adjacent the channel regions to form vertically integrated second layer transistors with the gate of the associated first layer of transistors being common to the second layer transistors, select ones of the drains and sources in the second layer transistors interconnected in accordance with a second polycrystalline silicon layer pattern;
- encapsulating the second layer transistors with an oxide mask;
- exposing all polycrystalline silicon and silicon surfaces not encapsulated with the oxide mask;
- forming titanium di-silicide on all exposed polycrystalline silicon and silicon surfaces to increase the conductivity thereof;
- interconnecting select ones of the drains and sources of the second layer transistors with the first polycrystalline silicon layer at select locations to interface with select ones of the sources, drains and gates of the first layer transistors in accordance with a predetermined second layer interconnect pattern; and
- interconnecting select ones of the drains and sources of the second layer transistors and select ones of the sources, drains and gates of the first layer transistors with external pads to allow external interface therewith.

9. The method of claim 8 wherein the step of forming and encapsulating the second layer transistors comprises:
- depositing a second layer of gate oxide on the substrate to a predetermined thickness over the gate areas;
- depositing a second polycrystalline silicon layer over the substrate isolated from the substrate by the second gate oxide layer and selectively doping the second polycrystalline silicon layer to define channel regions over the gate areas and source and drain regions on either side of the formed channel regions, the doping being of the second conductivity type;
- depositing an oxide layer over the second polycrystalline silicon layer;
- selectively removing by an etching process portions of the second poly layer to define the second layer of transistors with select ones of the sources and drains interconnected in accordance with the second polycrystalline silicon layer pattern; and
- sealing the peripheral edges of the remaining portions of the second polycrystalline silicon layer with a sidewall oxide.

10. The method of claim 8 wherein the step of depositing the second polycrystalline silicon layer comprises depositing a conformal polycrystalline silicon layer and the step of selectively doping comprises:
- applying a dopant impregnated spin-on oxide to the surface of the substrate to form a planarized layer such that the thickness of the spin on oxide is thinner proximate the portion of the second poly layer adjacent the gate areas, the portion of the second poly layer directly over the gate areas being topologically higher than the portion of the second polycrystalline silicon layer proximate the source and drain regions of the first layer transistors;
- removing a predetermined thickness of the spin on oxide layer to expose the portions of the second poly layer directly over the gate areas;
- driving the dopant in the remaining spin on oxide layer into the second poly layer to define the source and drain regions of the second layer transistors; and
- removing the spin on oxide.

11. The method of claim 8 wherein the step of forming titanium di-silicide comprises:
- depositing titanium to a predetermined thickness on the substrate;
- reacting the titanium such that all titanium in contact with exposed polycrystalline silicon or silicon forms titanium di-silicide;
- removing the titanium that has not reacted to form titanium di-silicide; and
- annealing the titanium di-silicide.

* * * * *